United States Patent [19]
Cordes

[11] Patent Number: 6,157,192
[45] Date of Patent: Dec. 5, 2000

[54] RECOVERY OF SIGNAL VOID ARISING FROM FIELD INHOMOGENEITIES IN ECHO PLANAR IMAGING

[75] Inventor: Dietmar Cordes, Middleton, Wis.

[73] Assignee: Wisconsin Alumni Research Foundation, Madison, Wis.

[21] Appl. No.: 09/246,622

[22] Filed: Feb. 8, 1999

Related U.S. Application Data

[60] Provisional application No. 60/081,688, Apr. 14, 1998.

[51] Int. Cl.[7] ........................................................ G01V 3/00
[52] U.S. Cl. ............................................ 324/309; 324/307
[58] Field of Search ..................................... 324/309, 307, 324/306, 314, 312, 300

[56] References Cited

U.S. PATENT DOCUMENTS

| | | | |
|---|---|---|---|
| 5,378,985 | 1/1995 | Hinks | 324/309 |
| 5,770,943 | 6/1998 | Zhou | 324/307 |
| 5,818,229 | 10/1998 | Kanazawa | 324/309 |

OTHER PUBLICATIONS

Multi–Gradient Echo with Susceptibility Inhomogeneity Compensation (MGESIC): Demonstration of fMRI in the Olfactory Cortex at 3.0 T, MRM 37:331–335 (1997), Yang, et al.
Reduction of T2* Dephasing in Gradient Field–Echo Imaging, Radiology 1989; 170:457–462, Haacke, et al.
The Influence of the Slice–Selection Gradient on Functional MRI of Human Brain Activation, JMR, Series B 103, 91–93 (1994), Frahm, et al.
Reduction of Susceptibility Artifacts in Gradient–Echo Imaging, MRM 23, 193–200 (1992), Cho, et al.
Removal of Local Field Gradient Artifacts in Gradient–Echo Images by Slice Excitation Profile Imaging (GESEPI) in High Field, Yang, et al.
Implementation of Dynamic Shimming for Multi–Slice Imaging, Magnetization, Reson. Syst. Research Lab, Stanford Univ., Morrell, et al.
Reduction of Image Distortion in the Presence of Metal, Depts of Radiol. & Physics, Vancouver BC Canada, McGowan, et al.
Correction of Dynamic $B_z$–field Artifacts in EPI, Bio. Research Inst. Med. Col. Of Wi, Birn, et al.
Fourier Transform of Multi–Gradient Echo with Susceptibility Inhomogeneity Compensation (3DFT–MGESIC): Improved SNR and $T_2$* Weighting for MRI, Yang et al.
Functional MR Imaging using Gradient Echo EPI in the Presence of Large Static Field Inhomogeneities, Yale University, R.T. Constable.
—no title—Ctr for NMR Research, Dept. Of Radio.Yang, et al.
Direct Flash MR Imaging of Magnetic Field Inhomogeneities by Gradient Compensation, MRM 6, 474–480 (1988), Frahm, et al.
The Benefits of Increasing Spatial Resolution as a Means of Reducing Artifacts Due to Field Inhomogeneities, MRI vol. 6, pp. 585–590, 1988, Young et al.
Combined Gradient–Echo and Asymmetric Spin–Echo (GREASE): Functional MRI Comparisons and Uses, Bio. Research Inst. Med. Col. Of WI, Bandettini, et al.
Functional MR Imaging Using Gradient–Echo Echo–Planar Imaging in the Presence of Large Static Field Inhomogeneities, JMRI 1995: 5:746–752, R.T. Constable.

*Primary Examiner*—Louis Arana
*Attorney, Agent, or Firm*—Quarles & Brady, LLP

[57] ABSTRACT

A prescan process is performed in which an EPI pulse sequence acquires a series of pilot images. Each pilot image is acquired with a different slice selection refocusing gradient and a rephasing map is produced which indicates the optimal refocusing gradient to be used for each pixel. The rephasing map is used to determine the optimal refocusing gradient amplitudes to use in a subsequent scan to reduce signal drop out caused by susceptibility gradients.

13 Claims, 7 Drawing Sheets

RECOVERY OF SIGNAL VOID ARISING FROM FIELD INHOMOGENEITIES IN ECHO PLANAR IMAGING

This application is based upon Provisional Application Ser. No. 60/081,688 filed on Apr. 14, 1998.

BACKGROUND OF THE INVENTION

The field of the invention is nuclear magnetic resonance imaging methods and systems. More particularly, the invention relates to the recovery of signal drop out in MR images caused by local susceptibility gradients at tissue boundaries.

When a substance such as human tissue is subjected to a uniform magnetic field (polarizing field $B_0$), the individual magnetic moments of the spins in the tissue attempt to align with this polarizing field, but precess about it at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that imperfections in the linear magnetic field gradients ($G_x$, $G_y$, and $G_z$) produce artifacts in the reconstructed images. It is a well known problem, for example, that eddy currents produced by gradient pulses will distort the magnetic field and produce image artifacts. Methods for compensating for such eddy current errors are also well known as disclosed, for example, in U.S. Pat. Nos. 4,698,591; 4,950,994; and 5,226,418. It is also well known that the gradients may not be perfectly uniform over the entire imaging volume, which may lead to image distortion. Methods for compensating this non-uniformity are well known, and for example, are described in U.S. Pat. No. 4,591,789.

MR imaging methods are also dependant on the presence of a homogeneous polarizing magnetic field $B_0$. Many methods have been devised to obtain a homogeneous and stable polarizing magnetic field, including the use of shim coils which can be periodically adjusted during calibration procedures. Such measures cannot, however, correct for magnetic field inhomogeneities arising from local susceptibility gradients produced when a patient is placed in the magnetic field. Such susceptibility gradients arise near air-tissue boundaries, for example, and in mild cases this can lead to reduced signal intensities in pixels located near such boundaries, and in severe cases it can lead to image artifacts such as pixel shifts and complete signal loss.

Methods have been proposed to recover the signal loss and signal dropout in MR images due to such susceptibility gradient inhomogeneities. These include using 3D-gradient echo methods, using higher image resolution, using tailored rf excitation pulses, and using multi-gradient echo acquisitions with susceptibility inhomogeneity compensation. Recognizing that the signal loss or drop out is due to the dephasing of the transverse magnetization in the local regions containing susceptibility gradients, another prior approach is to acquire multiple images and vary the slice refocusing gradient from the nominal value dictated by NMR theory. The multiple images may be summed together, or the physician may examine each image and combine the results in his own mind.

SUMMARY OF THE INVENTION

The present invention is a method for acquiring an MR image from a subject in which susceptibility gradients produce signal loss and signal dropout. More specifically, the method includes conducting a prescan of the patient to acquire a plurality of pilot images in which an image gradient is set to different values; a rephasing map is produced by calculating the optimal value of the image gradient which produces the maximum brightness for each image pixel; determining an imaging gradient setting by examining the optimal image gradient values in the rephasing map; and performing a scan using the image gradient setting.

A general object of the invention is to produce information which enables a scan to be prescribed that will eliminate or reduce signal loss or signal dropout. The rephasing map produced by the prescan indicates the optimal imaging gradient value to produce the optimal signal at each pixel in the reconstructed image. This rephasing map can be used to either manually or automatically prescribe one or more scans with an imaging gradient setting(s) that will produce the best image.

Another object of the invention is to automatically determine the imaging gradient setting(s) to achieve the best results. A rephasing gradient histogram is produced by counting the number of pixels in the rephasing map at each imaging gradient value. The rephasing gradient histogram is scanned to determine the best imaging gradient settings.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Loss of signal intensity occurs due to spin dephasing across a voxel. This dephasing is the result of susceptibility gradients and increases with the slice thickness. Here, we assume that the phase distribution of the spins varies only in the slice-direction (z) and gradients in the perpendicular direction (x and y) are negligible. The signal intensity S of a voxel can then be written as a function of the slice-select refocusing gradient offset $G_{ref}$ (relative to the precisely balanced slice-select gradient) as $$S(G_{ref}) = \int_{\Delta z} M \exp[-i\gamma z(G_{sus}TE + G_{ref}\tau)]dz \qquad (1)$$

where $M_0$ is the magnetization, $\gamma$ the gyromagnetic ratio, TE the echo time, $G_{sus}$ (z) the susceptibility gradient (assumed to be linear), $\tau$ the duration of the refocusing gradient pulse, and $\Delta z$ the slice thickness. Evaluation of the integral and calculating the absolute value of S leads to $$|S(G_{ref})|=m\Delta z|\text{sinc}[\gamma\Delta z(G_{sus}TE+G_{ref}\tau)/2]|. \qquad (2)$$

The observed signal has its maximum at $G_{ref}=-G_{sus}$ TE/$\tau$.

By performing a series of scans with different $G_{ref}$, a corresponding series of images can be reconstructed. The signal magnitudes at each x,y pixel in these images are then fit to a sinc function indicated by equation (2). From this best fit, the peak signal level $S_{max}$(x,y) of each pixel and the corresponding refocusing gradient $G_{max}$(x,y) that will produce this peak signal are determined. These values are stored in a rephasing map.

The resulting rephasing map may be used in a number of ways to reconstruct an image or to plan a further examination of the patient.

DESCRIPTION OF THE PREFERRED EMBODIMENT

Figure 1:
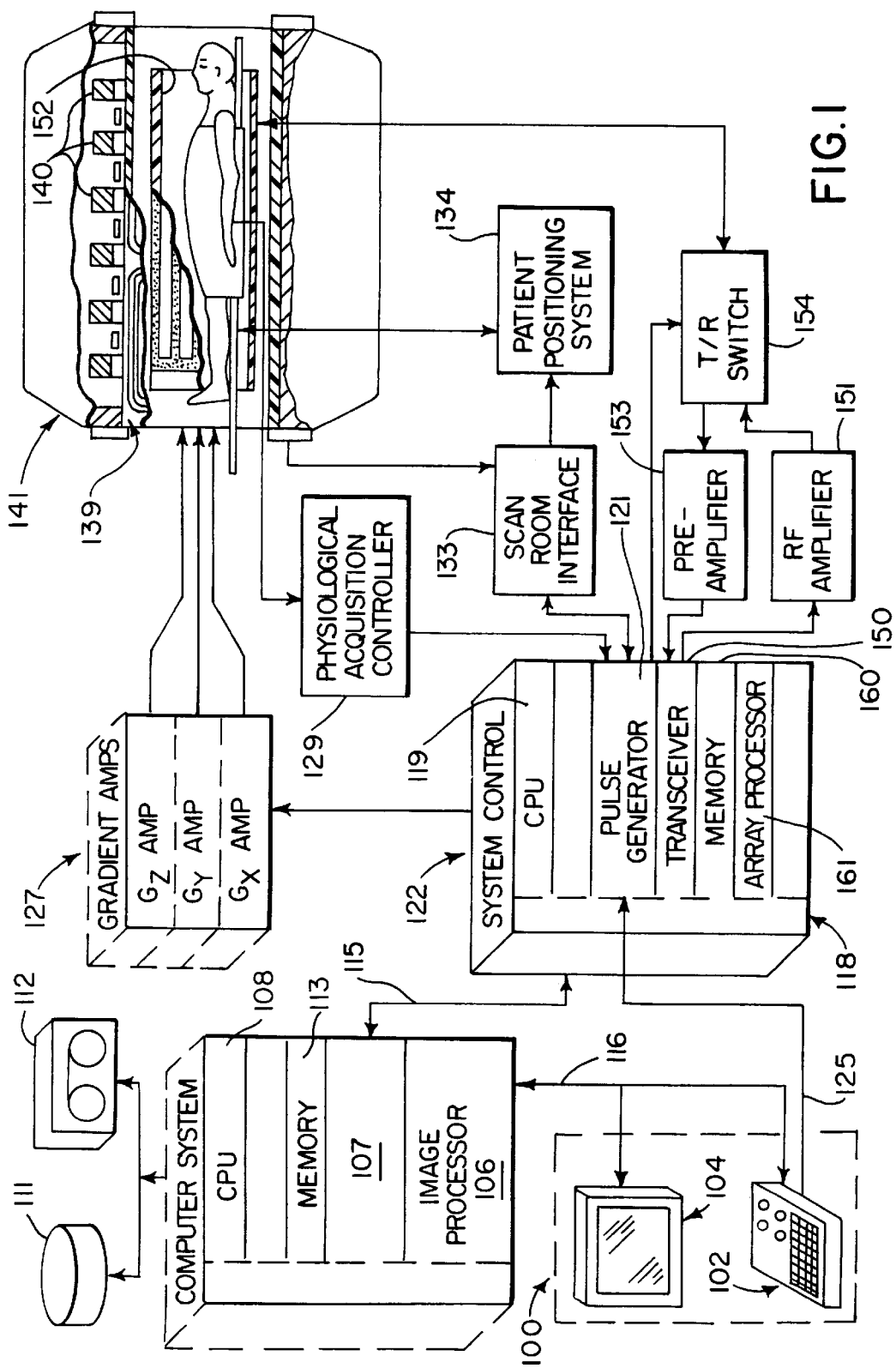
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, amplitude and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for spatially encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an image data set. This image data set is conveyed through the serial link 115 to the computer system 107 where it is stored in the disk memory 111. In response to commands received from the operator console 100, this image data set may be archived on the tape drive 112, or it may be further processed by the image processor 106 and conveyed to the operator console 100 and presented on the display 104.

Figure 2:
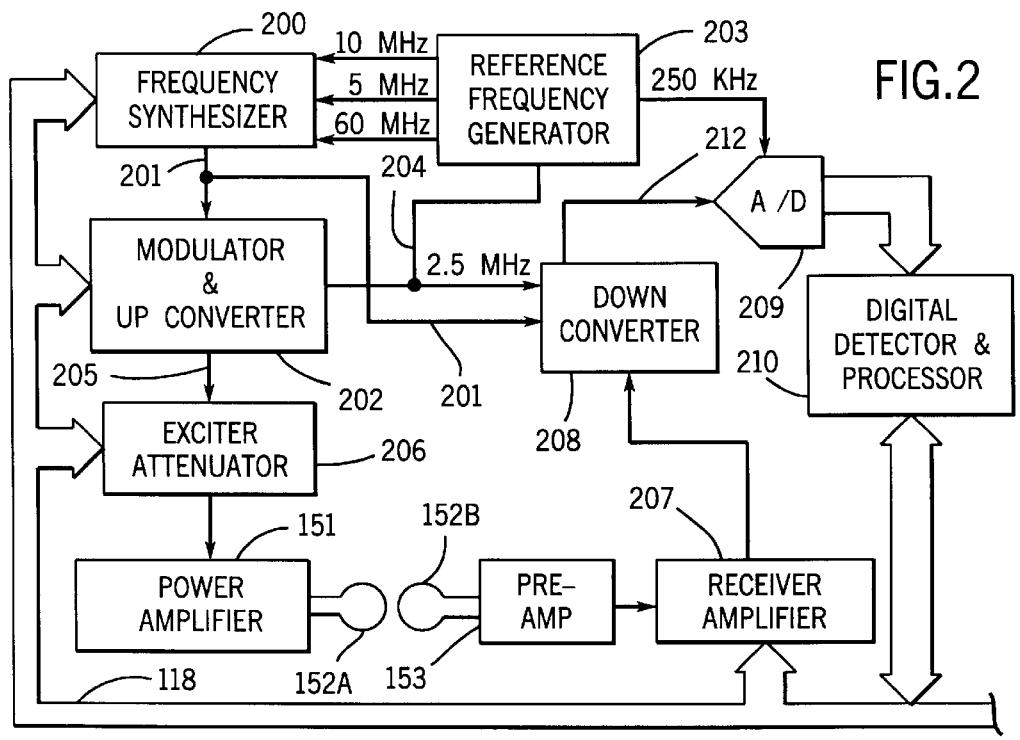
FIG. 2 is an electrical block diagram of the transceiver which forms part of the MRI system of FIG. 1.
Figure 3:
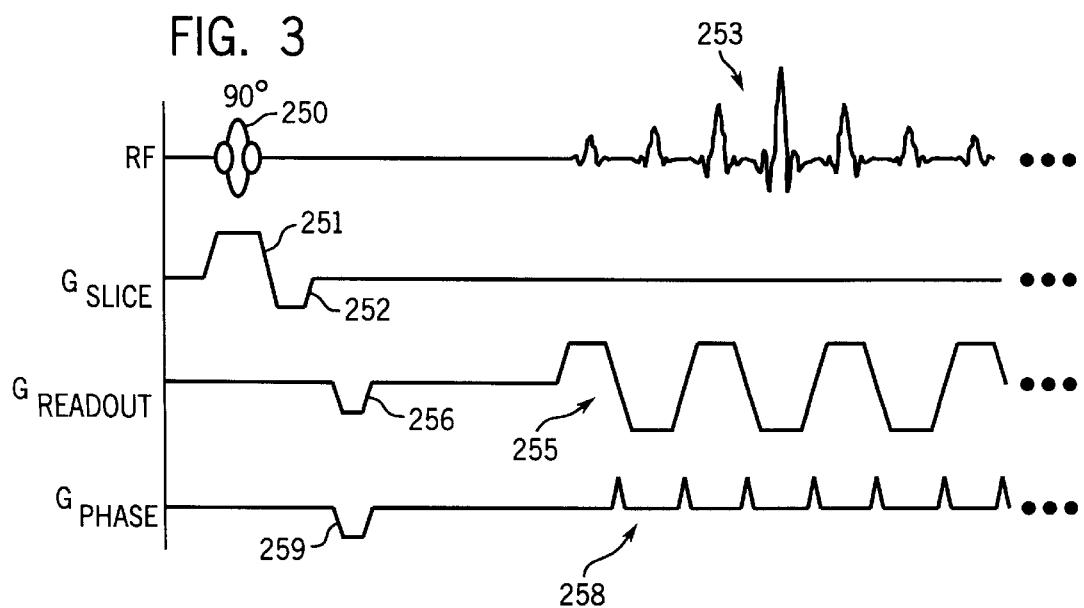
FIG. 3 is a graphic representation of an EPI pulse sequence.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877.

Referring still to FIGS. 1 and 2 the signal produced by the subject is picked up by the receiver coil 152B and applied through the preamplifier 153 to the input of another receiver amplifier 207. The receiver amplifier 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

Figure 4:
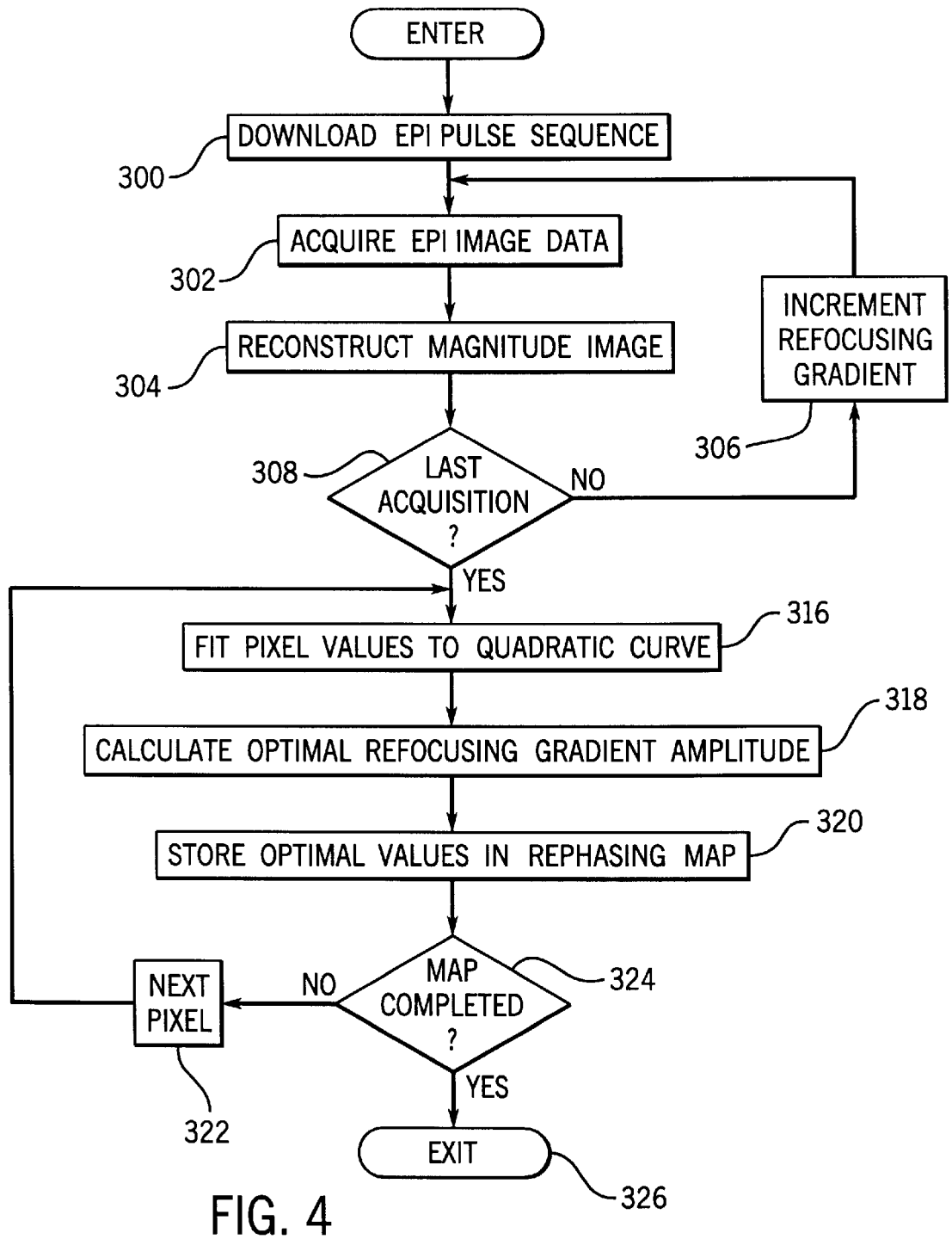
FIG. 4 is flow chart of a prescan process which is performed by the MRI system of FIG. 1.

The EPI pulse sequence employed in the preferred embodiment of the invention is illustrated in FIG. 4. A 90° RF excitation pulse 250 is applied in the presence of a slice-selection gradient pulse 251 to produce transverse magnetization in a slice. The excited spins are rephased, or refocused, by a negative lobe 252 on the slice-selection gradient. A total of $N_y$ (e.g., $N_y$=64) separate NMR echo signals, indicated at 253 are then acquired during the EPI pulse sequence. The NMR echo signals 253 are gradient recalled echoes produced by the application of an oscillating readout gradient 255. The readout sequence is started with a pre-phasing readout gradient lobe 256 and the echo signals 253 are produced as the readout gradient oscillates between positive and negative values. A total of $N_x$ (e.g., $N_x$=64) samples are taken of each NMR echo signal 253 during each readout gradient pulse 255. The successive $N_y$ NMR echo signals 253 are separately phase encoded by a series of phase encoding gradient pulses 258. A pre-phasing phase-encoding lobe 259 occurs before the echo signals are acquired to position the central view ($k_y$=0) at the desired echo time (TE). Subsequent phase encoding pulses 258 occur as the readout gradient pulses 255 switch polarity, and they step the phase encoding monotonically upward through $k_y$-space.

At the completion of the EPI pulse sequence, $N_x$ separate frequency encoded samples of $N_y$ separately phase encoded NMR echo signals 253 have been acquired. After time reversing every other echo, this $N_x \times N_y$ element k-space array of complex numbers is Fourier transformed along both of its dimensions ($k_y$ and $k_x$) to produce an image data set that indicates the NMR signal magnitude along each of its two dimensions (x and y).

One aspect of the present invention is a prescan process in which a rephasing map is produced to assist the operator in prescribing the optimal scan. This prescan process is performed by the system control 122 under the direction of a program that is executed after the patient is positioned in the magnet 141 and prior to the scan. This phase prescan uses the EPI pulse sequence described above, and as will become apparent, the size of the refocusing lobe 252 is varied during the process. It should be apparent to those skilled in the art, however, that variations in the slice selection gradient need not be limited to this particular gradient lobe. Application of a dephasing gradient along the slice selection axis at any time after RF excitation and prior to the readout of the first NMR signal will suffice. Also, if gradient moment mulling is employed to compensate for phase dispersion of blood flow, more than one refocusing lobe can be used and varied.

Figure 6:
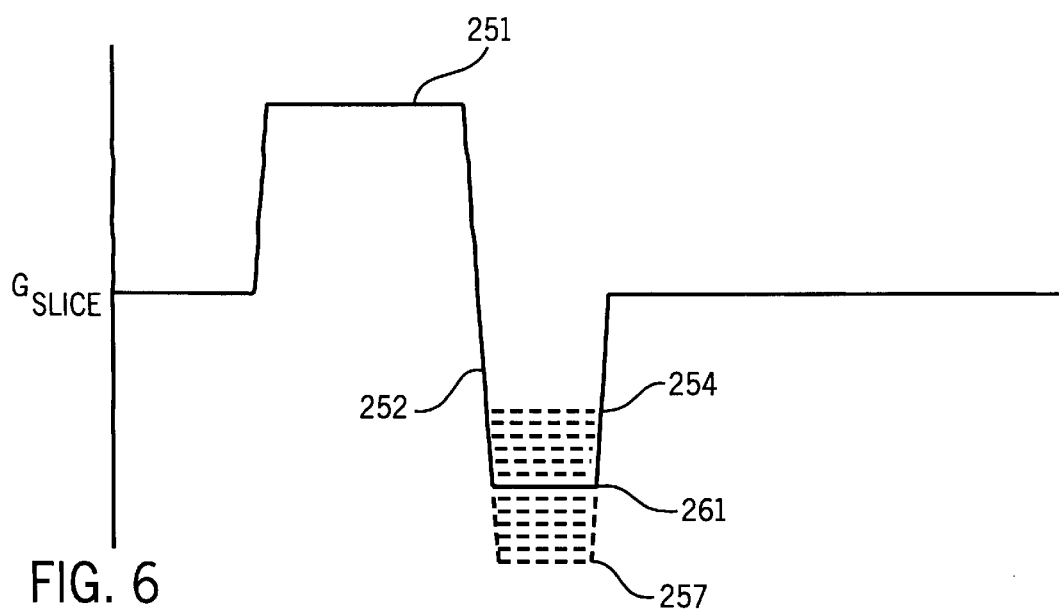
FIG. 6 is a graphic representation of a slice select gradient waveform that forms part of the pulse sequence of FIG. 3 and which is altered when practicing the method of FIG. 4.

Referring particularly to FIG. 4, the first step in the prescan process indicated at process block 300 is to download the EPI pulse sequence to the pulse generator 121 with the proper parameters for the pilot slice image to be acquired. In the preferred embodiment a flip angle of 90°, TE of 50 ms, a TR of 2000 ms, FOV of 24 cm×24 cm, slice thickness of 7 mm, gap of 2 mm, 18 slices, 64×64 imaging matrix and 125 kHz receiver bandwidth are specified. As will become apparent from the description below, this EPI pulse sequence is repeated a number of times during the prescan to acquire the NMR data necessary to produce a rephasing map. As shown best in FIG. 6, the amplitude of the rephasing lobe 252 on the slice selection gradient is stepped through a series of values during the prescan. These steps range from 0.6 times the nominal amplitude indicated at 254 to 1.4 times the nominal amplitude indicated at 261. The nominal amplitude is the amplitude which theory indicates will rephase the transverse magnetization after application of the slice selection gradient lobe 251 under ideal conditions.

Referring again to FIG. 4, after the EPI pulse sequence is downloaded and the rephasing lobe 252 is set to 0.6 nominal amplitude, a loop is entered in which the EPI pulse sequence is performed to acquire image data as indicated at process block 302. The acquired k-space NMR image data is Fourier transformed along two dimensions and a magnitude image is reconstructed as indicated at process block 304. This data acquisition and image reconstruction is repeated after incrementing the rephasing lobe amplitude as indicated at process block 306. When the rephasing lobe amplitude reaches 1.4 nominal value, the loop is exited as indicated at decision block 308. In the preferred embodiment twenty steps of the rephasing lobe amplitude are acquired and twenty corresponding pilot magnitude images $I_{1-20}$ are reconstructed. Each image I is a 64×64 array of pixel intensity values p(x,y).

Figure 7:
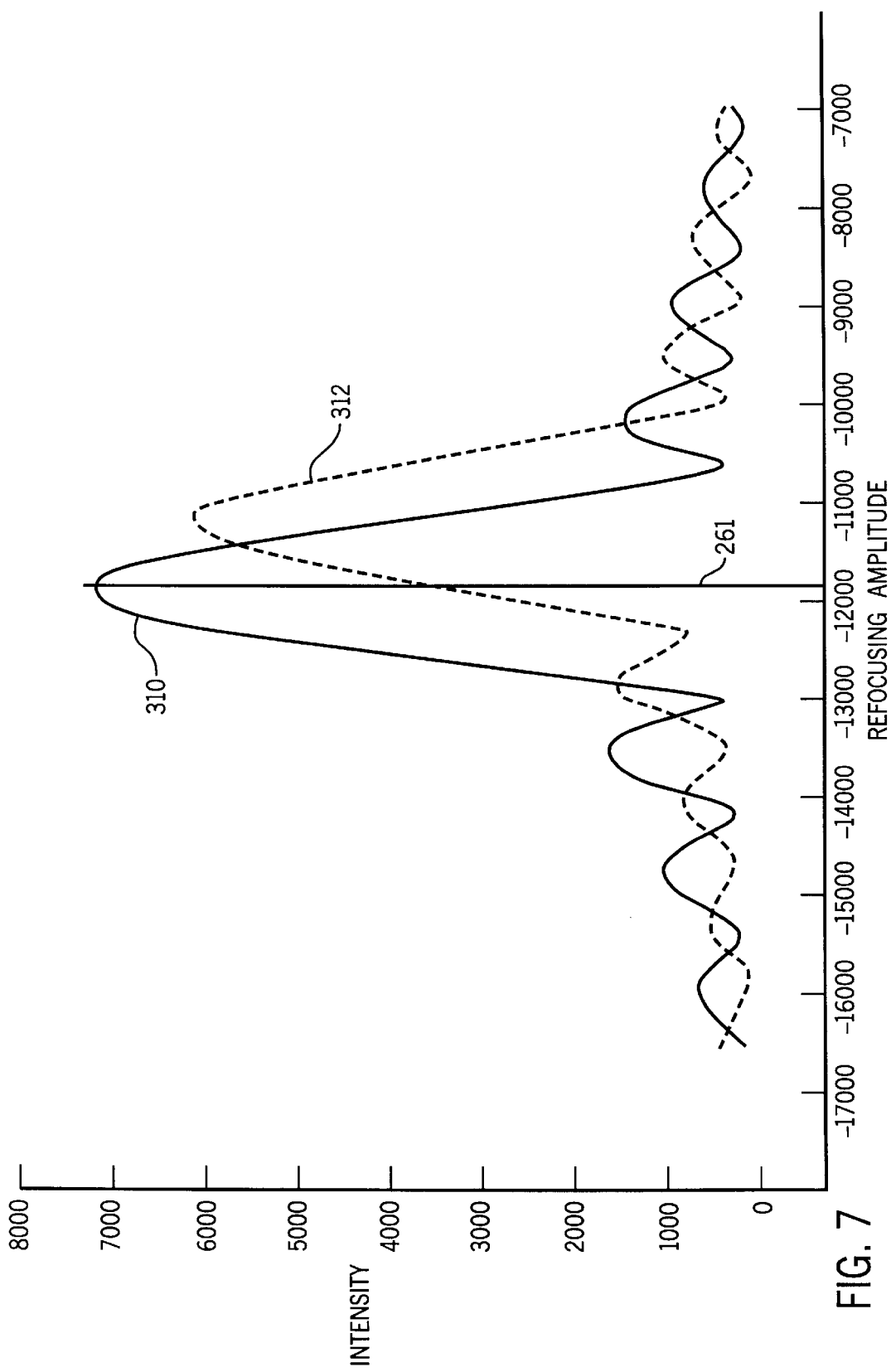
FIG. 7 is a graph of signal intensity as a function of refocusing gradient amplitude.

Corresponding pixel intensity values p(x,y) in the twenty images are examined next to determine the dephasing that occurs in different tissues throughout the slice image. Referring to FIG. 7, if the images are taken through the human brain, for example, the intensity values p(x,y) of pixels corresponding to the upper prefrontal cortex away from susceptibility gradients will have a peak amplitude at the nominal rephasing lobe amplitude 261. At other refocusing lobe amplitudes the signal intensity produced by the prefrontal cortex will be less and will lie on the sinc curve indicated by solid line 310. On the other hand, pixel intensity values p(x,y) corresponding to the visual cortex near the cerebellum will have a peak amplitude at a lower refocusing lobe amplitude as indicated by dotted line 312. In other words, the peak signal intensity that can be obtained from each pixel in the image is determined in part by the accuracy with which the refocusing gradient lobe rephases the transverse magnetization at that pixel location (x,y). The following steps in the prescan process examine the amplitude of the corresponding pixel intensity values p(x,y) in the twenty pilot images and calculate the optimal refocusing lobe amplitude for each of the 64×64 pixel locations.

Referring again to FIG. 4, a loop is entered in which the twenty pixel intensity values for one pixel location (x,y) are examined to find the optimal refocusing gradient amplitude for that pixel location. As indicated at process block 316, this is accomplished by fitting the values to a quadratic curve that approximates the central part of the sinc function. As indicated at process block 318, the peak in this quadratic curve is then located, and the optimal refocusing lobe gradient amplitude $G_{max}(x,y)$ indicated at this peak is stored in a 64×64 element rephasing map at a location therein corresponding to the pixel x,y location in the pilot images. In addition the maximum pixel intensity value $S_{max}(x,y)$ at this peak is also stored in the rephasing map at the same location as indicated at process block 320.

The process is repeated for each pixel location (x,y) in the pilot images $I_{1-20}$. The next pixel is selected at process block 322 and the processes 316, 318 and 320 are repeated. When all the pixel locations (x,y) have been processed as determined at decision block 324, the prescan is exited at 326.

Figure 8:
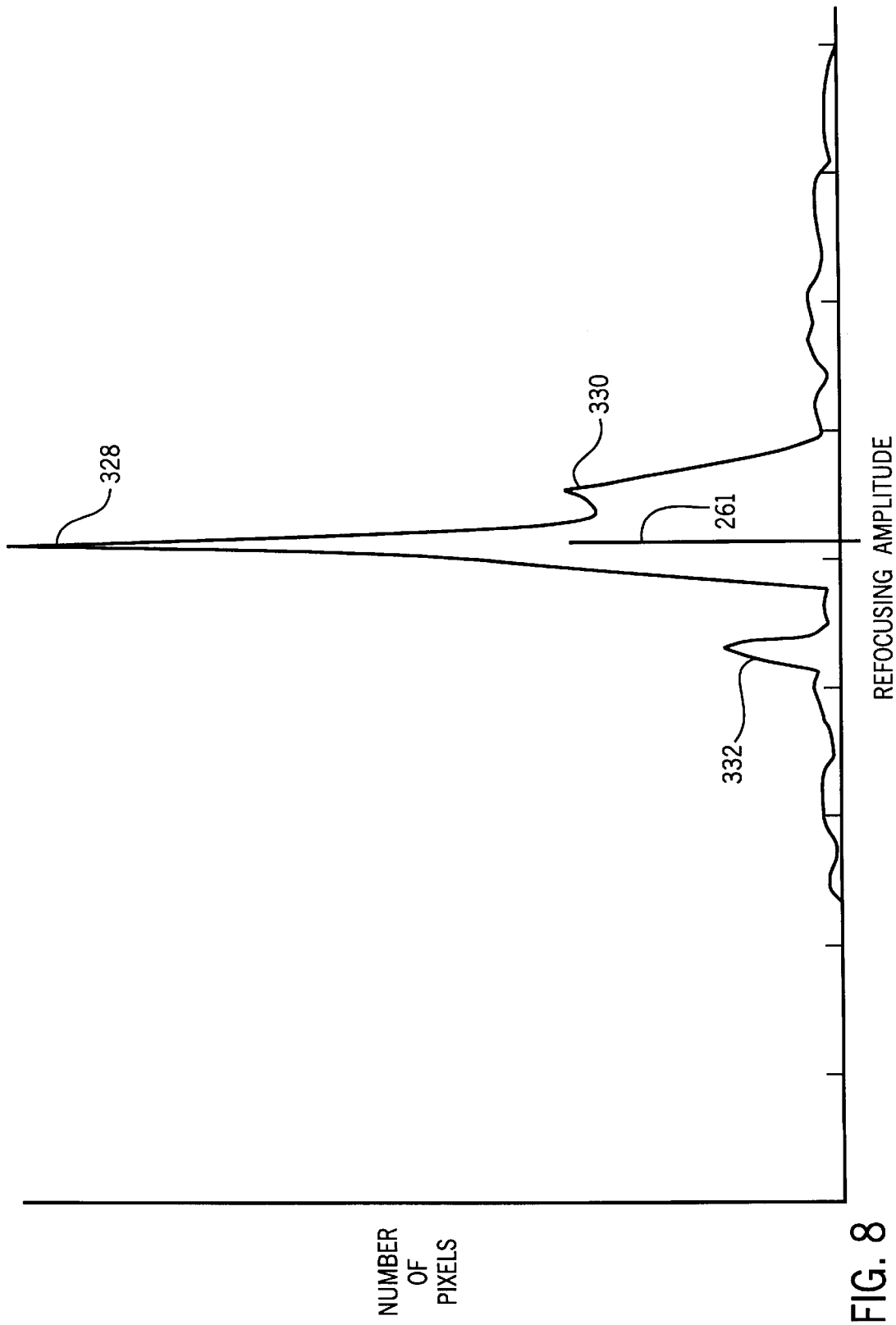
FIG. 8 is a graph of an exemplary histogram showing the number of pixels in an image which achieve peak signal intensity at different refocusing gradient amplitudes.

There are a number of ways in which the rephasing map can be used to prescribe the subsequent scan. In one embodiment a histogram is produced in which the number of pixels at each refocusing gradient amplitude is calculated. More specifically, a number of refocusing gradient amplitude "bins" are defined and the rephasing map is scanned to count the number of pixels in each bin. The resulting histogram is then displayed to the operator as shown in FIG. 8. This histogram will always have a huge peak 328 at the nominal refocusing gradient amplitude 261, since most pixels in an MR image will be properly rephased at this nominal amplitude. However, other smaller peaks may occur in the histogram as at 330 and 332 which indicate a significant number of pixels that can be brightened with a different refocusing gradient lobe amplitude. These can be identified manually and used to prescribe the subsequent scan of the patient.

Another preferred embodiment of the invention employs the rephasing map produced by the prescan process to automatically prescribe the subsequent scan. This is performed by the system control 122 under the direction of an automatic rephasing process. This process is illustrated in FIG. 5.

Figure 5:
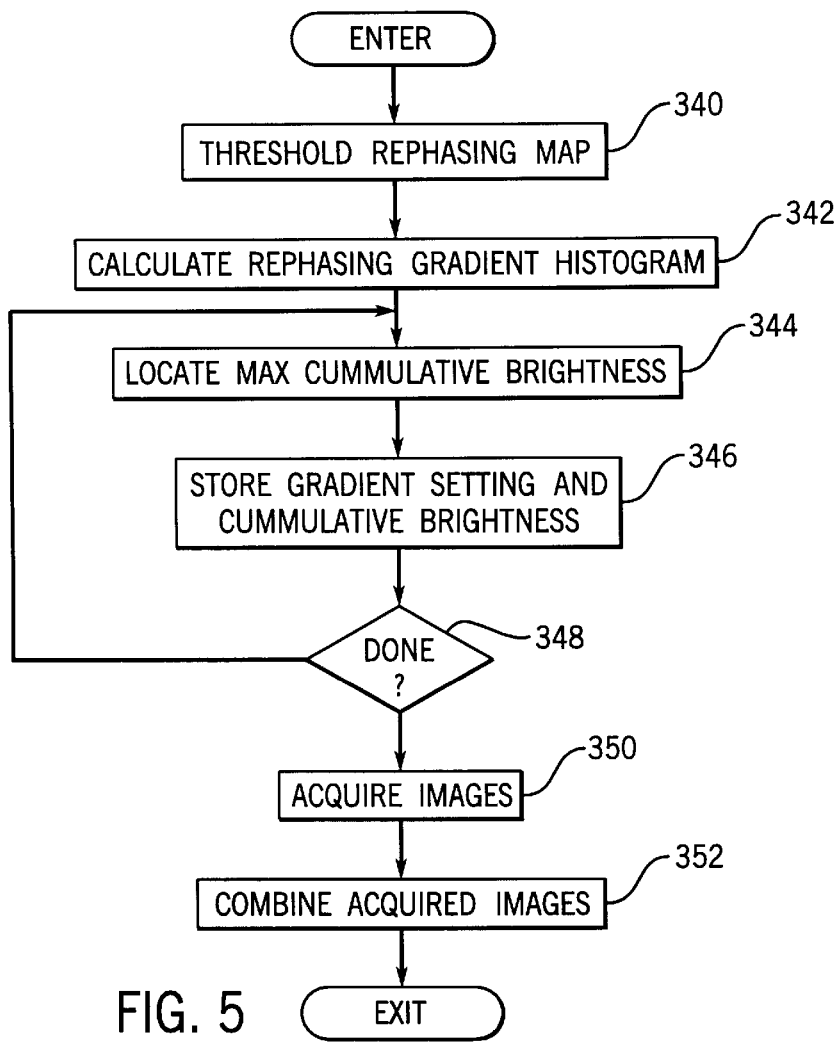
FIG. 5 is a flow chart of an automatic rephasing process performed by the MRI system of FIG. 1.

Referring particularly to FIG. 5, the automatic rephasing process filters the rephasing map as indicated at process block 340 by thresholding the corresponding magnitude images $I_{1-20}$. If the sum of the twenty intensity values at a particular pixel location (x,y) does not exceed a minimum value, then the corresponding location (x,y) in the rephasing map is set to zero. This eliminates from further processing the background pixels.

The next step as indicated by process block 342 is to calculate a cumulative brightness histogram. As described above, this involves counting the number of pixels in the rephasing map at each rephasing gradient amplitude. However, contrary to the histogram described above, each rephasing gradient bin is not just the number of pixels, but is instead, the sum of the corresponding maximum intensity values stored in the dephasing map. This histogram thus indicates the cumulative brightness at each rephasing gradient value, or histogram bin.

A loop is then entered in which the best rephasing gradient amplitude settings are determined from the rephasing gradient histogram. This is accomplished by scanning the rephasing gradient histogram to determine the gradient setting which will produce the highest cumulative brightness. Rather than searching for the single highest cumulative brightness value, however, a band, or window, of the highest cumulative brightness levels is selected by sliding the window across the histogram bin. The width of this window is set in the preferred embodiment to the width of the central lobe in the sinc function at one-half its peak value. This window is advanced through successive bins of the rephasing gradient histogram, and the cumulative brightness of the pixels within the window is calculated. When the maximum cumulative brightness is found, as indicated at process block 344, the pixels within the window are marked with a segment number. The segment number is stored in the rephasing map at the corresponding pixel locations (x,y) and the windowed pixels are removed from the rephasing gradient histogram so that they are not included in subsequent segments. And finally, as indicated at process block 346, the refocusing gradient setting for the segment is stored along with a cumulative brightness value of all the windowed pixels in this segment.

Figure 9:
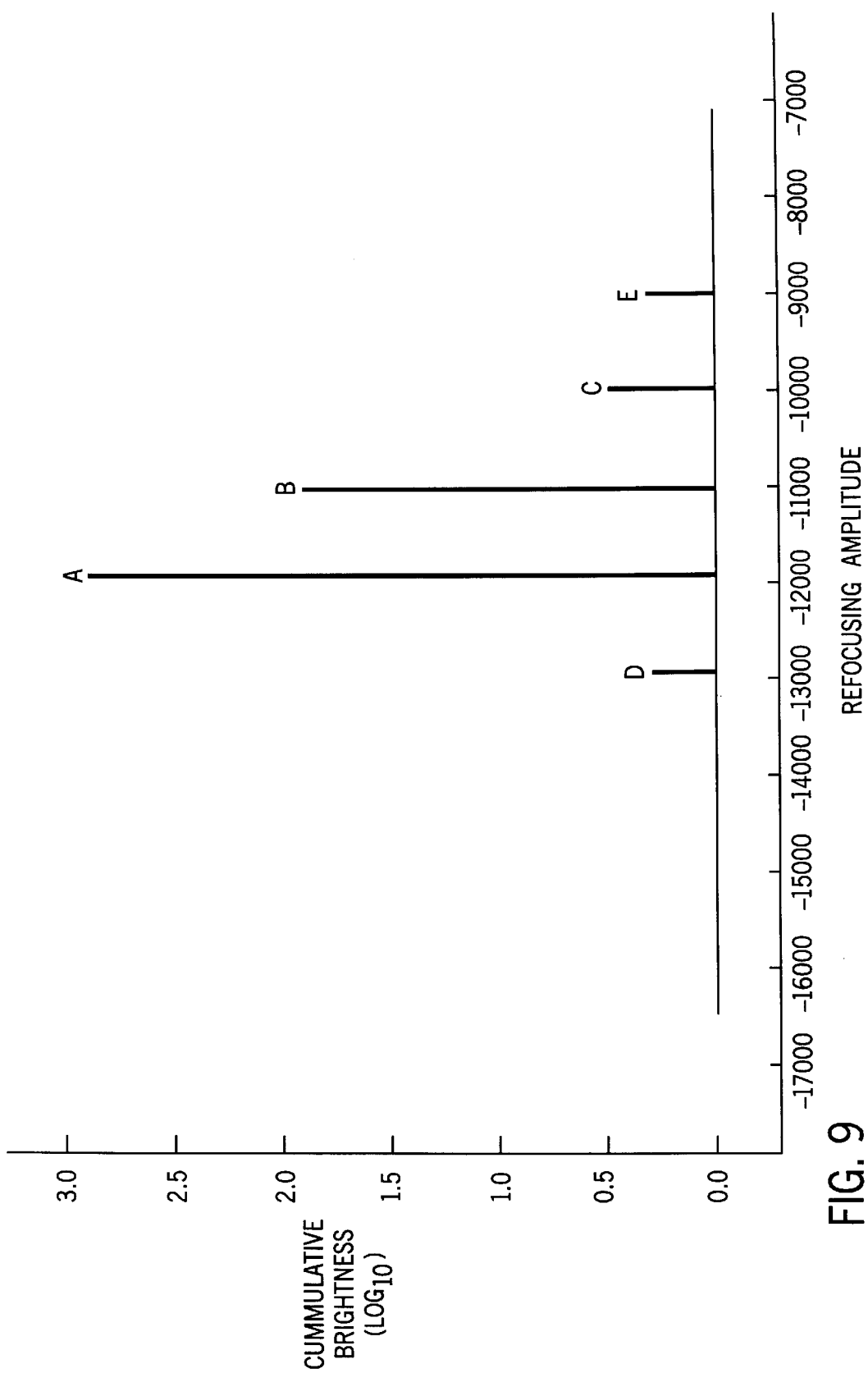
FIG. 9 is a graph of an exemplary segmentation map showing the cumulative pixel brightness at specific refocusing gradient amplitudes.

The process of segmenting the image pixels by selecting the window of highest cumulative brightness is repeated at decision block 348 until all the pixels have been selected and removed from the rephasing gradient histogram. For head studies, this is typically accomplished in five or less passes. As a result, the 64×64 array of pilot image pixels is segmented and a refocusing gradient setting and a cumulative brightness value is stored for each segment. FIG. 9 is a graphic illustration of these stored segment values, where the horizontal axis is the refocusing gradient amplitude and the vertical axis is the cumulative brightness of the pixels in the segment. Five segments labeled A, B, C, D and E are shown in this example segmentation map.

The scan now proceeds automatically to acquire image data at each of the stored refocusing gradient amplitudes as indicated at process block 350. In the example of FIG. 9, this requires five separate image acquisitions at five different refocusing gradient amplitudes. The number of image acquisitions can be reduced either automatically or manually if necessary. For example, the two or three segments with the highest cumulative brightness may be selected and their refocusing gradient amplitudes used in two or three acquisitions.

The resulting reconstructed images are then combined into a single composite image as indicated at process block 352. This is performed by selecting the pixel values from each acquired image using the segment numbers stored in the rephasing map. That is, for the first image, the pixels corresponding to segment 1 pixels in the rephasing map are selected and stored at the corresponding locations (x,y) in the composite image. The same procedure is used for each of the other acquired images and their corresponding segment numbers. When fewer images than identified segments are acquired, the pixels of unacquired segments are selected from one of the acquired images. The choice is determined by which acquired image refocusing gradient amplitude is closest to the stored optimal value $G_{max}(x,y)$ for the particular pixel.

It should be apparent to those skilled in the art that the rephasing map produced by the prescan process can be used in many ways to improve the quality of the MR images in which structures are obscured or drop out due to susceptibility gradients. The invention is believed to have particular application to functional MRI where the activity in various parts of the brain are imaged.

What is claimed is:

1. A method for producing an image of a subject with an MRI system, the steps comprising:

performing a prescan to produce a rephasing map, the prescan including:
   a) acquiring a plurality of pilot images of the subject using an NMR pulse sequence that employs an imaging magnetic field gradient, and wherein the imaging magnetic field gradient is set to different values in the plurality of pilot image acquisitions;
   b) calculating the optimal imaging magnetic field gradient value for each pixel in the pilot images by examining magnitudes of the corresponding pixels in the plurality of acquired pilot images;
   c) storing the optimal imaging magnetic field gradient values at corresponding pixel locations in the rephasing map;
   d) determining an imaging magnetic field gradient setting using the values stored in the rephasing map; and
   e) performing a scan of the patient using the NMR pulse sequence with the imaging magnetic field gradient setting.

2. The method as recited in claim 1 in which step b) includes fitting the magnitudes of the corresponding pixels in the pilot images to a curve, and determining the peak of the curve.

3. The method as recited in claim 2 in which the peak of the curve indicates the optimal imaging magnetic field gradient value for a pixel and an optimal brightness value for the pixel, and the optimal brightness value is also stored in the rephasing map at the corresponding pixel location.

4. The method as recited in claim 1 in which determining an imaging magnetic field gradient setting in step d) includes producing a histogram from the rephasing map which is indicative of the number of pixels that have optimal brightness at each of a plurality of imaging magnetic field gradient values.

5. The method as recited in claim 4 in which the imaging magnetic field gradient setting is determined by displaying this histogram so that the setting can be manually selected.

6. The method as recited in claim 1 which includes storing at each pixel location in the rephasing map a pixel value indicative of pixel brightness at the corresponding stored optimal imaging magnetic field gradient value, and in which determining an imaging magnetic field gradient setting in step d) includes producing a cummulative brightness histogram from the rephasing map which is indicative of the sum of the stored pixel brightness values at rephasing map pixel locations that have optimal brightness at each of a plurality of imaging magnetic field gradient values.

7. The method as recited in claim 6 in which the imaging magnetic field gradient setting is determined by scanning the cummulative brightness histogram.

8. The method as recited in claim 7 in which the scanning is performed by sliding a window through the cummulative brightness histogram and locating the magnetic field gradient setting which provides the maximum cummulative brightness within the window.

9. The method as recited in claim 1 in which the NMR pulse sequence is an echo planar imaging sequence.

10. The method as recited in claim 9 in which the imaging magnetic field gradient is a slice select gradient.

11. The method as recited in claim 10 in which the imaging magnetic field gradient is a refocusing gradient.

12. The method as recited in claim 1 in which step d) includes determining a plurality of imaging magnetic field gradient settings and storing in the rephasing map segment numbers which indicate the settings for the pixel locations;
   in which step e) includes performing a scan and reconstructing an image for each of said magnetic field gradient settings; and
   f) combining each of the images into a single output image by selecting pixel values from each using the stored segment numbers.

13. The method as recited in claim 12 in which the NMR pulse sequence is an echo planar imaging pulse sequence and the imaging magnetic field gradient is a slice gradient.

* * * * *